United States Patent
Kathrein

(10) Patent No.: US 8,293,386 B2
(45) Date of Patent: Oct. 23, 2012

(54) AL-TI-RU-N-C HARD MATERIAL COATING

(75) Inventor: Martin Kathrein, Reutte (AT)

(73) Assignee: Ceratizit Austria Gesellschaft mbH, Reutte/Tirol (AT)

( * ) Notice: Subject to any disclaimer, the term of this patent is extended or adjusted under 35 U.S.C. 154(b) by 352 days.

(21) Appl. No.: 12/667,171

(22) PCT Filed: Jun. 26, 2008

(86) PCT No.: PCT/AT2008/000231
§ 371 (c)(1),
(2), (4) Date: Dec. 29, 2009

(87) PCT Pub. No.: WO2009/003206
PCT Pub. Date: Jan. 8, 2009

(65) Prior Publication Data
US 2010/0190032 A1    Jul. 29, 2010

(30) Foreign Application Priority Data
Jun. 29, 2007 (AT) .................................. GM408/2007

(51) Int. Cl.
*B32B 9/00* (2006.01)
(52) U.S. Cl. ............ 428/697; 51/307; 51/309; 428/216; 428/336; 428/698; 428/699
(58) Field of Classification Search .................... 51/307, 51/309; 428/216, 336, 697, 698, 699; 204/192.15, 204/192.16
See application file for complete search history.

(56) References Cited

U.S. PATENT DOCUMENTS

| | | | | |
|---|---|---|---|---|
| 4,252,862 A | * | 2/1981 | Nishida | 428/699 |
| 4,680,438 A | * | 7/1987 | Witting et al. | 428/698 |
| 6,250,855 B1 | * | 6/2001 | Persson et al. | 51/309 |
| 6,824,601 B2 | * | 11/2004 | Yamamoto et al. | 428/698 |
| 7,056,602 B2 | * | 6/2006 | Horling et al. | 428/697 |
| 7,244,519 B2 | | 7/2007 | Festeau et al. | |
| 7,727,621 B2 | * | 6/2010 | Nordlof et al. | 428/697 |
| 2004/0076856 A1 | | 4/2004 | Hugosson | |

FOREIGN PATENT DOCUMENTS

| | | | |
|---|---|---|---|
| DE | 10109634 C1 | | 10/2002 |
| JP | 03-031471 | * | 2/1991 |
| JP | 8199340 A | | 8/1996 |
| JP | 8199341 A | | 8/1996 |
| JP | 8209332 A | | 8/1996 |
| RU | 2070610 | * | 12/1996 |
| RU | 2087258 | * | 8/1997 |
| WO | 2006023222 A1 | | 3/2006 |

OTHER PUBLICATIONS

Austrian Search Report dated Jan. 15, 2008.
* cited by examiner

*Primary Examiner* — Archene Turner
(74) *Attorney, Agent, or Firm* — Laurence A. Greenberg; Werner H. Stemer; Ralph E. Locher

(57) ABSTRACT

A monolayer or multilayer nitridic or carbonitridic hard material coating contains Al and Ti and at least one of the layers comprises the composition $(Al_xTi_yRu_zMe_v)(N_aC_{1-a})$, with $0.45 \leq x \leq 0.75$, $0.20 \leq y \leq 0.55$, $0.001 \leq z \leq 0.10$. $0 \leq v \leq 0.20$, $0.8 \leq a \leq 1.1$. Me is selected from the group of elements including Si, B, W, Mo, Cr, Ta, Nb, V, Hf, Zr. The Ru-containing hard material coating has a decreasing hardness shifted towards the higher temperature range and therefore an improved wear resistance.

18 Claims, 2 Drawing Sheets

AL-TI-RU-N-C HARD MATERIAL COATING

BACKGROUND OF THE INVENTION

Field of the Invention

The invention relates to a single-layer or multilayer nitridic or carbonitridic hard material coating containing Al and Ti.

Highly wear-resistant hard material layers are applied to bodies subject to wear, in particular wear parts and tools, to increase the wear resistance. These coatings usually have hardness values in the range from 15 to above 40 GPa. Hard materials which have been found to be useful include carbides, carbonitrides, nitrides and oxides, which are often employed together as mutually supplementary layers in a layer arrangement. Here, layers of different hard materials are arranged alternately in order to meet various requirements in respect of adhesion, wear and toughness. Substrate bodies used are wear-resistant materials such as cemented carbides, cermet materials, hard materials and tool steels.

For many applications, $(Al_xTi_{1-x})(N_yC_{1-y})$ coatings which combine excellent wear properties with high oxidation resistance have been found to be useful. A coating having a cubic crystal structure and the composition $(Al_xTi_{1-x})(N_yC_{1-y})$ where $0.56 \leq x \leq 0.75$; $0.6 \leq y \leq 1$ is, for example, described in JP 2644710. The addition of Al to TiN increases the coating hardness and improves the oxidation resistance. At $x>0.75$, the coating hardness decreases due to the formation of hexagonal phase. At $x<0.56$, the oxidation start temperature drops to below 800° C.

$(Al_xTi_{1-x})(N_yC_{1-y})$ coatings can be produced by means of physical (PVD) or chemical vapour deposition (thermal CVD, PACVD). A preferred PVD process is magnetron sputtering. Here, metallic Al—Ti targets, which can be in alloyed form or in the form of composite target, are atomized using reactive gases and $(Al_xTi_{1-x})(N_yC_{1-y})$ is deposited in this way. The $(Al_xTi_{1-x})(N_yC_{1-y})$ phases formed are generally metastable and form coherent precipitates in the temperature range from 600° C. to 1000° C., as a result of which self-hardening can be achieved during use at high temperatures. The composition of the deposited coating is determined predominantly by the composition of the sputtering target. In addition, the coating can contain further constituents, for example proportions of a process gas, impurities or other additives.

The introduction of further alloying elements, the deposition of multilayer coatings and/or targeted setting of the process parameters, for example the bias voltage, enables the coating to be optimized in respect of structural, tribological and resulting cutting machining properties. It is also desirable to keep the proportion of hexagonal structure in the two-phase system fcc(TiAl)N+hcp(AlTi)N low.

Thus, for example, the addition of Si is described in U.S. Pat. No. 5,558,653, the addition of Ca, Dy, Nd, Ce, Sr is described in JP 08-199340, that of Y is described in JP 08-199341 and that of Zr, Hf, V, Nb, Ta, Cr, Mo, W is described in DE 36 11 492.

The evermore demanding requirements in respect of wear resistance and ductility, properties which in turn determine the tool life, can no longer be met by the abovementioned layer systems in many applications.

BRIEF SUMMARY OF THE INVENTION

It is therefore an object of the present invention to fulfil this requirement for improved wear resistance, in particular in very demanding tribological stress combinations, for example in the case of highly abrasive countermaterials or high temperatures at the cutting edges of cutting tips, and the requirement for improved process reliability of the tools by means of high stability against notching and chipping of the cutting edges.

The object is achieved by the features of the independent claim. The hard material coating can have a single-layer or multilayer structure.

At least one coating layer has the composition $(Al_xTi_yRu_zMe_v)(N_aC_{1-a})$, where $0.45 \leq x \leq 0.75$;
$0.2 \leq y \leq 0.55$;
$0.001 \leq z \leq 0.1$;
$0 \leq v \leq 0.2$
and
$0.8 \leq a \leq 1.1$.

Me is at least one element from the group consisting of Si, B, W, Mo, Cr, Ta, Nb, V, Hf and Zr. If a plurality of elements are selected from this group, v is the total content of these elements. The fact that the coating can have (x+y+z+v) values in the range from 0.9 to 1.1 and a can have values of from 0.8 to 1.0 means that nitrides and carbonitrides having values which deviate slightly from the stoichiometric composition, which can also occur as a result of the process, also have the properties according to the invention. The best results were able to be achieved when (x+y+z+v)=1.

According to the invention, the metals titanium and/or aluminum in the AlTiN or AlTiNC matrix are replaced by ruthenium.

Studies have shown that ruthenium does not form nitridic, metallic or intermetallic phases or compounds. Varying the ruthenium content at a constant ratio of Al:(Ti+Ru)=2:1 demonstrated that a shift in the cubic preferential orientation from (200) to (111) occurs with increasing ruthenium content. Likewise, an expansion of the atom lattice in the (200) orientation was shown by the FWHM (full width at half maximum) value. This indicates at least partial forced dissolution of the ruthenium atoms in the AlTi(Me)N or AlTi(Me)NC lattice.

Addition of ruthenium improves the hot hardness, especially in the temperature range>700° C. This is presumably attributable to increased precipitation of AlN. The cubic phase was still able to be detected at use temperatures of 900° C. A shift in the fcc/hcp phase transition therefore also occurs. As a result, the hard material coating keeps its abrasion resistance even at high use temperatures, which is of particularly great importance for use in cutting tools. In addition, the oxidation behaviour of the hard material coating is influenced positively by the addition of ruthenium.

If the ruthenium content is too low (z<0.001), a satisfactory effect can no longer be determined. At high ruthenium contents (z>0.1), the room temperature hardness drops as a result of formation of hexagonal phase. In addition, such high ruthenium contents are not economically sensible because of the high price of ruthenium. The preferred content of ruthenium is $0.005 \leq z \leq 0.06$.

If x is below 0.45, no satisfactory oxidation resistance is observed.

When x>0.75, the coating hardness drops to an unacceptably low level due to formation of hexagonal phase constituents. If y is below 0.2, the coating hardness is too low. At y>0.55, once again no satisfactory oxidation resistance is observed.

The hard material coating can be made up of one or more layers having a different composition and/or structure. At least one coating layer has the composition according to the invention.

It has been found that the elements silicon, boron, tungsten, molybdenum, chromium, tantalum, niobium, vanadium, hafnium and zirconium in ruthenium-containing AlTiN and AlTiNC coatings have a similar effect as in ruthenium-free coatings. The optimal silicon and boron content is, based on the proportion of metal, from 0.1 to 1 atom %, the optimal chromium, tungsten and molybdenum content is from 1 to 10 atom % and the optimal vanadium, niobium, tantalum, zirconium and hafnium content is from 1 to 20 atom %. The addition of these elements increases the coating hardness in a concentration range where the cubic phase is predominantly present and generally reduces the coating ductility. The composition therefore has to be matched to the application, with recourse being able to be made to experience with ruthenium-free coatings.

In a preferred embodiment, the ruthenium-containing coating or layer does not contain any further metallic elements apart from aluminum and titanium.

The inventive advantage of the addition of ruthenium is observed both in the case of nitrides and in the case of carbonitrides. In the case of carbonitrides, the nitrogen content can be replaced by up to 20 atom % of carbon. In a preferred embodiment, $0.9 \leq a \leq 1$. The best results have been able to be achieved with stoichiometric nitride coatings (a=1).

As mentioned above, the cubic lattice is the dominant crystal structure. Here, dominant means that the proportion of cubic phase is greater than 50%. However, small proportions of X-ray-amorphous and hexagonal phases can occur in addition to the cubic phase without the advantages of the invention being significantly reduced.

It has been found to be particularly useful for the hard material coating of the invention to be in the form of a multilayer coating. Here, a ruthenium-containing layer preferably alternates with a ruthenium-free layer.

In a further preferred embodiment, the ruthenium-containing layer has a ruthenium content of $0.005 \leq z \leq 0.05$. The aluminum content is $0.62 \leq x \leq 0.72$ and the titanium content is $0.27 \leq y \leq 0.39$. The ruthenium-free layer has an aluminum and titanium content of $0.45 \leq x,y \leq 0.55$.

The best results have been able to be achieved when the thickness of the individual layers is from 5 to 30 nanometers. The ruthenium-free intermediate layer is once again preferably cubic, with the cubic phase being able to be achieved by means of an Al:Ti ratio of from 0.8 to 2 and/or by adjusting the process parameters. Among the process parameters, the bias voltage should once again be emphasized and preferably has a value of <−40 volt. The cubic ruthenium-free intermediate layer makes it possible to increase the aluminum content in the ruthenium-containing layer without the proportion of hexagonal phase becoming unacceptably high.

As indicated in more detail in the examples, the coating of the invention is, in preferred embodiments, deposited on cubic boron nitride or cemented carbide. It is possible to use the customary bonding layers, for example TiN, and covering layers, for example aluminum oxide or aluminum mixed oxides. In the case of turning tools, the preferred coating thickness is from 3 to 14 μm and the ruthenium content is $0.01 \leq z \leq 0.06$. In the case of milling tools, the preferred coating thickness is from 2 to 8 μm and the ruthenium content is $0.005 \leq z \leq 0.02$.

As preferred deposition processes, mention may be made of PVD processes and among these plasma-supported gas-phase coating deposition processes, for example magnetron sputtering, electron evaporation, ion plating or laser-supported PVD processes. Arc vaporization processes are also suitable, especially in the development phase for determining optimal coating compositions. The metallic elements deposited in the coating have a composition which is generally very close to the composition of the material used for the target.

In the following examples, the composition of the coating according to the invention will consequently be defined by the composition of the target.

DESCRIPTION OF THE INVENTION

Example 1

Cemented carbide tips having the composition WC, 9.6% by weight of Co, 7.3% by weight of mixed carbides of the type CNMG 120408 EN-TM were produced and provided by means of arc vaporization with coatings having the following composition:

Specimen 1:
Single-layer Al—Ti—N coating, produced using a target composition of $Al_xTi_y$, where x=0.5 and y=0.5; coating thickness=5.18 μm (prior art).

Specimen 2:
Al—Ti—N, produced using a target composition $Al_xTi_y$, where x=0.33 and y=0.67; coating thickness=5.70 μm (prior art).

Specimen 3:
Al—Ti—N multilayer coating, produced using a target composition $Al_xTi_y$, where x=0.5 and y=0.5, alternating with $Al_xTi_y$, where x=0.33 and y=0.77. Thickness of the individual layers=7 nm, total coating thickness 4.86 μm (prior art).

Specimen 4:
Al—Ti—Ru—N-containing multilayer coating, produced using the target composition $Al_xTi_yRu_z$ where x=0.67, y=0.32 and z=0.01, alternating with $Al_xTi_y$, where x=0.5 and y=0.5; thickness of the individual layers=7 nm, total coating thickness=5.9 μm (according to the invention).

Specimen 5:
Al—Ti—Ru—N multilayer coating, produced using the target composition $Al_xTi_yRu_z$ where x=0.67, y=0.28 and z=0.05, alternating with $Al_xTi_y$, where x=0.5 and y=0.5; thickness of the individual layers=7 nm, total coating thickness=4.53 μm (according to the invention).

The samples were produced in a production-scale Oerlikon Balzers RCS PVD unit. The ruthenium-containing sputtering targets used were produced by powder metallurgy. The multilayer coatings according to the invention were produced by replacing a target by a target having a composition according to the invention with otherwise identical process parameters. The specimens used were in each case positioned in the same positions in the coating reactor.

The specimens 1 to 5 were then subjected to a comparative cutting machining test. This was continuous longitudinal turning of Ck60 steel (DIN 1.1221) using a cooling lubricant emulsion and a cutting speed $v_c$=200 m/min, a feed f=0.25 mm/revolution and an advance depth $a_p$=2 mm. A wear width of 0.2 mm was specified as termination criterion.

Figure 1:
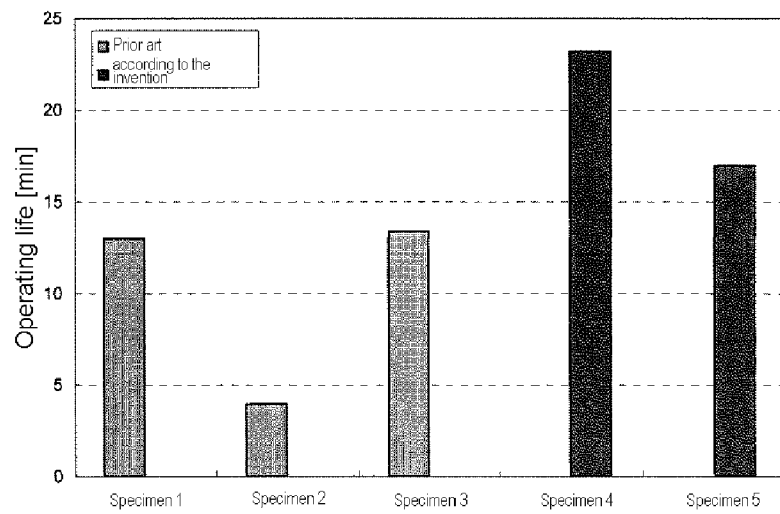
FIG. 1 shows the operating life of cemented carbide specimens in a longitudinal turning experiment. The end of the operating life is specified as a wear width on the main cutting edge of 0.2 mm.

As shown in FIG. 1, the specimens 4 and 5 according to the invention have a superior wear resistance.

Example 2

Cemented carbide indexable inserts of the type DCMW 11T304 with tips of cubic boron nitride were provided with a coating according to the invention as per specimen 4 in Example 1 and compared with uncoated tips. In a first experiment, the hot-working steel W 300 (DIN 1.2343) was machined dry. The cutting speed $v_c$ was 200 m/min, the feed f was 0.05 mm and the advance depth was 0.3 mm.

In a second experiment, gray cast iron of the grade GG 25 (DIN 0.6025) was likewise machined dry. The cutting speed $v_c$ was 350 m/min, the feed f was 0.2 mm and the advance depth was 1.0 mm.

Figure 2A:
FIG. 2a shows the wear after longitudinal turning experiments (hot-working steel W300) using an uncoated c-BN specimen (prior art) after a use time of 13 min.
Figure 2B:
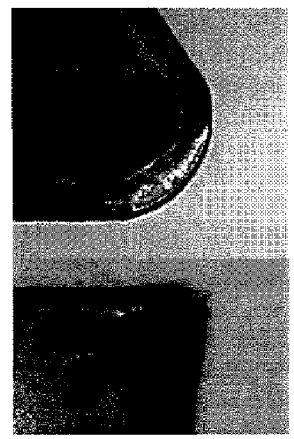
FIG. 2b shows the wear after longitudinal turning experiments (hot-working steel W300) using a c-BN specimen coated according to the invention after a use time of 13 min.
Figure 2C:
FIG. 2c shows the wear after longitudinal turning experiments (hot-working steel W300) using a c-BN specimen coated according to the invention after a use time of 19 min.

As once again shown in FIG. 2, the specimen according to the invention (FIG. 2b, c) shows a significantly more favourable cratering behaviour. A significant increase in operating life compared to the uncoated hard material c-BN (FIG. 2a) is therefore achieved.

Figure 3:
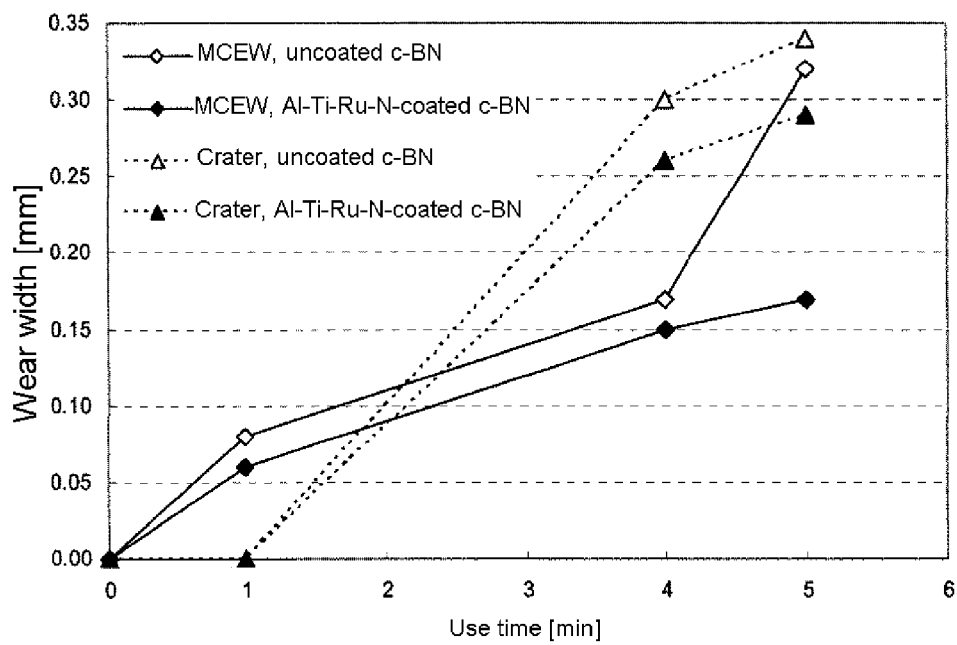
FIG. 3 shows the wear width versus use time for longitudinal turning experiments (gray cast iron GG25) using uncoated c-BN specimens and c-BN specimens coated according to the invention.

As FIG. 3 shows, both the wear on the flank of the main cutting edge (MCEW) and the wear on the face, referred to as crater wear, are reduced.

FIG. 3 thus shows that the ruthenium-containing coating according to the invention deposited on a cubic boron nitride substrate material results in a significant increase in the operating life compared to an uncoated specimen.

Example 3

Cemented carbide tips having the composition WC, 9.0% by weight of Co, 4.0% by weight of mixed carbides of the type SEKN 1203AFSN were provided with a coating according to the invention as per specimen 4 in Example 1 and a coating according to the prior art (specimen 3 in Example 1) and subjected to a comparable cutting machining test.

For this purpose, a 42CrMo4 steel (1.7225) having a strength of 1100 MPa was milled dry by means of a milling tool having a diameter of 160 mm using a cutting speed $v_c$ of 230 m/min, a feed per tooth $f_t$ of 0.3 mm and an advance $a_p$ of 2 mm in the single-tooth climb milling mode. The termination criterion for the cutting machining experiments was set at a wear width of 0.3 mm on the flank of the main cutting edge.

Figure 4:
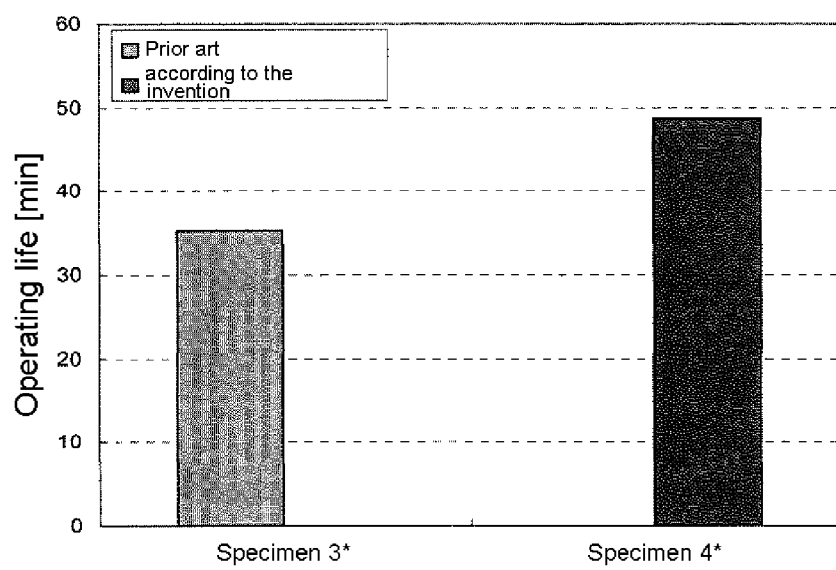
FIG. 4 shows the operating life of cemented carbide milling tools. The end of the operating life is specified as a wear width on the main cutting edge of 0.3 mm.

As FIG. 4 shows, a significant improvement in the operating life of the specimen coated according to the invention compared to the specimen according to the prior art was also able to be achieved here.

Example 4

Cemented carbide tips having the composition WC, 9.0% by weight of Co, 4.0% by weight of mixed carbides of the type SEKN 1203AFSN were coated with a multilayer coating according to the invention, with a ruthenium-free coating being produced using the target composition $Al_xTi_y$ where x=0.5 and y=0.5. The composition of the ruthenium-containing coating is shown in Table 1. The thickness of the individual layers was 7 nm, and the total coating thickness was 5.2±0.8 μm. The coated samples were subjected to a comparative cutting machining test as per Example 3.

TABLE 1

| Composition | | | | | Operating |
|---|---|---|---|---|---|
| x | y | z | v | a | life [min.] |
| 0.67 | 0.32 | 0.01 | 0 | 0.9 | 43 |
| 0.67 | 0.27 | 0.01 | 0.005 B | 1 | 48 |
| 0.67 | 0.27 | 0.01 | 0.05 Cr | 1 | 43 |
| 0.67 | 0.22 | 0.01 | 0.1 V | 1 | 49 |
| 0.67 | 0.22 | 0.01 | 0.1 Ta | 1 | 48 |
| 0.67 | 0.22 | 0.01 | 0.1 Zr | 1 | 44 |

The operating life values in Table 1 show that an improvement in the coating properties can be achieved in the application by addition of further metallic alloying components. However, since the addition of further alloying components can be associated with a decrease in the ductility values and the influence of the ductility properties on the operating life behaviour is very specific to the application, the selection of the alloying element and the content thereof is dependent on the respective application.

The invention claimed is:

1. A single-layer or multilayer nitridic or carbo-nitridic hard material coating, comprising:
   a content of Al and a content of Ti, and formed with at least one coating layer having the composition:
   $(Al_xTi_yRu_zMe_v)(N_aC_{1-a})$, where
   $0.45 \leq x \leq 0.75$;
   $0.2 \leq y \leq 0.55$;
   $0.001 \leq z \leq 0.1$;
   $0 \leq v \leq 0.2$;
   $0.9 \leq (x+y+z+v) \leq 1.1$
   $0.8 \leq a \leq 1.0$; and
   Me is one or more elements selected from the group consisting of Si, B, W, Mo, Cr, Ta, Nb, V, Hf, Zr, and v is a total content of said elements.

2. The hard material coating according to claim 1, wherein x+y+z+v=1.

3. The hard material coating according to claim 1, wherein v=0.

4. The hard material coating according to claim 1, wherein:
   $0.001 \leq v \leq 0.01$ for Si, B;
   $0.01 \leq v \leq 0.1$ for Cr, Mo, W;
   $0.01 \leq v \leq 0.2$ for V, Nb, Ta, Zr, Hf.

5. The hard material coating according to claim 1, wherein $0.9 \leq a \leq 1$.

6. The hard material coating according to claim 5, wherein a=1.

7. The hard material coating according to claim 1, wherein a dominant crystal structure is cubic.

8. The hard material coating according to claim 1, wherein $0.005 \leq z \leq 0.06$.

9. The hard material coating according to claim 1, wherein said at least one coating layer is one of a plurality of layers in a multilayer structure.

10. The hard material coating according to claim 9, wherein said plurality of layers include layers having $0.001 \leq z \leq 0.1$ alternating with layers having z=0.

11. The hard material coating according to claim 10, wherein:
　layers having:
　　$0.62 \leq x \leq 0.72$;
　　$0.27 \leq y \leq 0.39$;
　　$0.005 \leq z \leq 0.05$; and
　　$v=0$;
　alternate with layers having:
　　$0.45 \leq x \leq 0.55$;
　　$0.45 \leq y \leq 0.55$;
　　$z=0$; and
　　$v=0$.

12. The hard material coating according to claim 9, wherein a layer thickness is between 5 and 30 nm.

13. The hard material coating according to claim 9, wherein a crystal structure of a layer in which $z=0$ is cubic.

14. A coating method, which comprises coating cubic boron nitride with a hard material coating according to claim 1.

15. A coating method, which comprises coating cemented carbide with a hard material coating according to claim 1.

16. A turning tool, comprising a hard material coating according to claim 1, with $0.01 \leq z \leq 0.06$ and a coating thickness from 3 to 14 μm.

17. A milling tool, comprising a hard material coating according to claim 1, with $0.005 \leq z \leq 0.02$ and a coating thickness from 2 to 8 μm.

18. A method of producing a hard material coating, depositing a hard material coating according to claim 1 by a PVD process.

* * * * *